(12) United States Patent
Fiorenza et al.

(10) Patent No.: US 7,319,425 B2
(45) Date of Patent: Jan. 15, 2008

(54) COMPARATOR-BASED SWITCHED CAPACITOR CIRCUIT FOR SCALED SEMICONDUCTOR FABRICATION PROCESSES

(75) Inventors: John K. Fiorenza, Cambridge, MA (US); Todd Sepke, Cambridge, MA (US); Hae-Seung Lee, Cambridge, MA (US); Charles G. Sodini, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 144 days.

(21) Appl. No.: 11/343,064

(22) Filed: Jan. 30, 2006

(65) Prior Publication Data
US 2006/0208938 A1    Sep. 21, 2006

Related U.S. Application Data

(60) Provisional application No. 60/663,850, filed on Mar. 21, 2005.

(51) Int. Cl.
*H03M 1/12* (2006.01)
(52) U.S. Cl. ...................... 341/172; 341/166
(58) Field of Classification Search ......... 341/136–172
See application file for complete search history.

(56) References Cited

U.S. PATENT DOCUMENTS 5,059,820 A * 10/1991 Westwick .................... 327/539

(Continued)

OTHER PUBLICATIONS

Copeland, M. et al.; "Dynamic Amplifier for M.O.S. Technology"; Apr. 10, 1979; pp. 301-302; Electronics Letters, vol. 15, No. 10.

(Continued)

*Primary Examiner*—Lam T. Mai
(74) *Attorney, Agent, or Firm*—Guerin & Rodriquez, LLP; William G. Guerin

(57) ABSTRACT

Described is a switched capacitor circuit for performing an analog circuit function. Unlike conventional switched capacitor circuits employing operational amplifiers, the switched capacitor circuit uses a comparator and does not require direct feedback between the input and output of the comparator. The switched capacitor circuit includes a first and a second switched capacitance network, a comparator and a current source. The first switched capacitance network has an input terminal to receive a circuit input voltage during a first phase. The comparator has an input terminal in communication with the first switched capacitance network and an output terminal in communication with the second switched capacitance network through a switched terminal. The current source communicates with the switched capacitance networks and supplies a current to charge the networks during a second phase. The circuit can be used, for example, to provide high gain amplification in integrated circuits.

16 Claims, 5 Drawing Sheets

U.S. PATENT DOCUMENTS 6,445,305 B2 * 9/2002 Andersson et al. .... 340/636.15
2005/0258998 A1 * 11/2005 Confalonieri et al. ....... 341/172

OTHER PUBLICATIONS

Chern J.-G. et al.; "An 11 bit, 50 kSample/s CMOS A/D Converter Cell using a Multislope Integration Technique"; 1989; p. 6.2.1-6.2.4; IEEE 1989 Custom Integrated Circuits Conference "No Month".

Fried,: David L.; "Analog Sample-Data Filters"; IEEE Journal of Solid-State Circuits; Aug. 1972; p. 302-304.

Hosticka, B. J. et al.; "MOS Sampled Data Recursive Filters Using Switched Capacitor Integrators"; IEEE Journal of Solid-State Circuits vol. SC-12, No. 6; Dec. 1977; p. 600-608.

Lewis, S. H. et al.; "Session XVII: Analog Techniques"; Feb. 26, 1987 IEEE International Solid-State Circuits Conference; pp. 210, 211 & 405.

Lewis, S. H. et al.; "A Pipelined 5-Msample/s 9-bit Analog-to-Digital Converter"; IEEE Journal of Solid-State Circuits; vol. SC-22, No. 6; Dec. 1987; pp. 954-961.

Buss, Dennis; "Device Issues in the Integration of Analog/RF Functions in Deep Submicron Digital CMOS"; 1999 IEEE; pp. 17.3.1-17.3.4 "No Month".

1995 National Semiconductor Corporation; "Special Sample and Hold Techniques"; Application Note 294; Apr. 1982; 4 pgs.

Williams, Jim; "High Speed Comparator Techniques"; Linear Technology; Application Note 13; Apr. 1985; pp. AN13-1-AN13-32.

* cited by examiner

COMPARATOR-BASED SWITCHED CAPACITOR CIRCUIT FOR SCALED SEMICONDUCTOR FABRICATION PROCESSES

RELATED APPLICATION

This application claims the benefit of the earlier filing date of U.S. Provisional Patent Application Ser. No. 60/663,850, filed Mar. 21, 2005, entitled "Switched Capacitor Circuits without Operational Amplifiers," the entirety of which is incorporated herein by reference.

FIELD OF THE INVENTION

The present invention relates generally to a switched capacitor circuit and, more particularly, to a switched capacitor circuit for integrated circuits manufactured according to scaled semiconductor processes.

BACKGROUND OF THE INVENTION

Modern scaled complementary metal-oxide semiconductor (CMOS) processes are typically optimized for digital circuits. Process advancements such as lower voltage power supplies and shorter gate lengths result in low power, high speed digital circuits, but can also result in higher power, low performance analog circuits. Lower output resistance, reduced power supply voltage, increased threshold variation and gate leakage present design challenges for analog and mixed signal systems.

The design of high gain operational amplifiers (hereafter op-amps) is one example of a design challenge resulting from the continued scaling of CMOS processes. High gain op-amps are critical components of many analog and mixed signal circuits, and are especially important in switched capacitor implementations of analog circuits such as the pipelined analog-to-digital converters. As gate length decreases, the intrinsic gain per unit current of a device also decreases. Although a smaller gate length increases the transconductance, the reduction in the output resistance dominates. Moreover, it is not practical to maintain an acceptable intrinsic gain per unit current by using longer devices in a scaled implementation, especially when increased frequency capability is required. In addition, the output resistance of modem scaled devices is not linearly proportional to gate length; increasing the gate length does not significantly increase the output resistance of the device.

Scaled processes generally utilize lower voltages to prevent gate oxide damage or device breakdown during operation. To achieve satisfactory gain in an amplifier designed in a scaled process, it is often necessary to utilize a cascode topology; however, a cascode topology using a reduced supply voltage generally results in a substantially reduced voltage swing. Modern low voltage scaled processes result in inherently less gain and voltage swing than older processes, consequently widely used analog design styles such as switched capacitor circuits need to be modified to compensate for these effects. Switched capacitor circuits demand high performance from op-amps included in the circuits. In a highly scaled CMOS process it is generally difficult to achieve the required op-amp performance.

SUMMARY OF THE INVENTION

In one aspect, the invention features a switched capacitor circuit for performing an analog circuit function. The switched capacitor circuit includes a first and a second switched capacitance network, a comparator and a current source. The first switched capacitance network has an input terminal to receive a circuit input voltage during a first phase. The comparator has an input terminal in communication with the first switched capacitance network and an output terminal in communication with a first switched terminal of the second switched capacitance network. The current source is in communication with the first and the second switched capacitance networks and supplies a current to charge the first and second switched capacitance networks during a second phase.

In another aspect, the invention features a method for performing an analog circuit function in a circuit comprising a comparator in communication with a switched capacitance network and a load capacitor. An input voltage is sampled using the switched capacitance network during a first phase. A voltage present at a node in the switched capacitance network is applied to an input terminal of the comparator during a first part of a second phase. The voltage at the node is responsive to the sampled circuit input voltage. A reference voltage is applied to the switched capacitance network during the first part of the second phase and terminated at the start of a second part of the second phase. A current is supplied to the switched capacitance network and the load capacitor during the second part of the second phase and terminated when an output state of the comparator changes during the second part of the second phase.

In yet another aspect, the invention features a method for performing an analog circuit function in a circuit comprising a comparator in communication with a switched capacitance network and a switched load capacitor. The switched load capacitor has a switch to couple the switched load capacitor to a first reference voltage. An input voltage is sampled using the switched capacitance network during a first phase. A voltage present at a node in the switched capacitance network is applied to the input terminal of the comparator during a first part of a second phase. The voltage at the node is responsive to the sampled circuit input voltage. A second reference voltage is applied to the switched capacitance network during the first part of the second phase and terminated at the start of a second part of the second phase. A first ramp waveform is supplied to the switched capacitance network and the load capacitor during the second part of the second phase.

In still another aspect, the invention features a stage for an analog to digital converter. The stage includes a clocked comparator, a comparator, a first and a second sampling capacitor, a current source and a load capacitor. The clocked comparator has an input terminal to receive an input voltage and provide a bit value in response. Each sampling capacitor has a first terminal in communication with an input terminal of the comparator. Each sampling capacitor also has a second terminal configured to receive the input voltage during the first phase. The second terminal of the first sampling capacitor is configured to receive a negative supply voltage during a first part of a second phase and the second terminal of the second sampling capacitor is configured to receive a second reference voltage during the second phase. The current source is in communication with the second terminal of the first sampling capacitor during a second part of the second phase. The load capacitor has a first terminal configured to receive the first reference voltage in response to an output voltage generated by the comparator and has a second terminal in communication with the second terminal of the first sampling capacitor during the second phase.

BRIEF DESCRIPTION OF THE DRAWINGS

The above and further advantages of this invention may be better understood by referring to the following description in conjunction with the accompanying drawings, in which like numerals indicate like structural elements and features in the various figures. The drawings are not necessarily to scale, emphasis instead being placed upon illustrating the principles of the invention. Circuit drawings are generally depicted in a single-ended fashion for clarity although the circuits are typically implemented in a differential configuration.

DETAILED DESCRIPTION

In brief overview, the present invention relates to a switched capacitor circuit having a comparator for high gain amplification in integrated circuits. Unlike conventional switched capacitor circuits employing op-amps, the switched capacitor circuit of the present invention uses a comparator and does not require direct feedback between the input and output of the comparator. Because feedback is eliminated, the design requirements of the switched capacitor circuit are relaxed and various scaled CMOS processes (e.g., 90 nm CMOS) can be used to fabricate the circuit. The circuit provides improved performance when compared with op-amp based switched capacitor circuits. Although the circuit is described below with respect to a pipeline analog-to-digital converter (ADC), the switched capacitor circuit of the present invention can be used with any of a variety of circuits based on switched capacitors, including generally ADCs, digital-to-analog converters (DACs), sample and hold circuits, integrators and filters.

The switched capacitor circuit of the present invention employs a non-clocked comparator which can be contrasted with the op-amp used in a traditional switched capacitor circuit. During operation, the op-amp maintains the voltage at its inverting input near zero at all time and provides the current to charge the load capacitor. In contrast, the switched capacitor circuit of the present invention does not maintain the voltage at its inverting input near zero at all time; however, the voltage at the inverting input is maintained near zero when the output voltage is sampled to ensure an accurate output voltage. Current sources provide the current to drive the load capacitance. The comparator and op-amp perform the same role in different ways; therefore the requirements placed on each component are different. The op-amp-based circuit has to achieve high gain, high speed, low noise, stability under feedback and high output voltage swing with low power consumption. The comparator-based circuit only has to achieve low noise and moderate speed operation with low power consumption. The reduced requirements of the comparator-based circuit are easier to satisfy using scaled CMOS than the more stringent requirements of the op-amp-based circuit.

Figure 1:
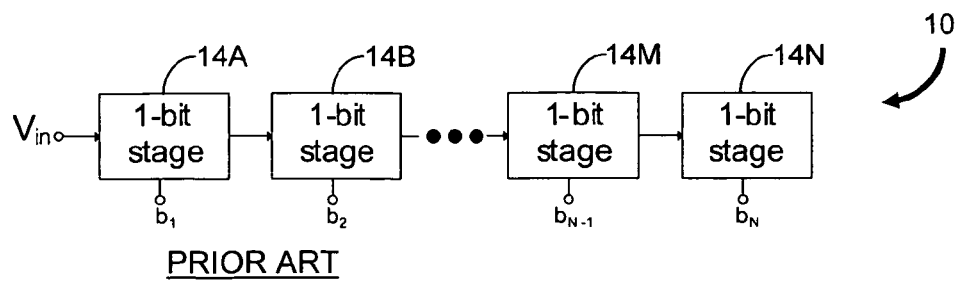
FIG. 1 is a block diagram of a conventional pipeline analog-to-digital converter.

FIG. 1 depicts a conventional pipeline ADC 10. The sampling rate and resolution of the ADC 10 can vary depending on a particular implementation. For example, the sampling rate can range from less than 200 KHz to more than 500 MHz and the resolution can be between eight bits and 15 bits. The pipeline ADC 10 has many applications that require medium speed (e.g., 5–200 MHz sampling rate) and resolution (e.g., 8–14 bits) such as cellular phones, cellular base stations, wireless LAN transceivers, wireline transceivers, digital still cameras, digital video cameras and medical imaging devices.

The pipeline ADC 10 includes stages 14A through 14N (generally 14). All of the stages 14 operate on different samples at the same time. The first stage 14A receives an input sample, resolves a bit and passes its output to the second stage 14B. The first stage 14A accepts another input sample while the second stage 14B operates on the previous output of the first stage 14A. Each stage 14 does not wait for the previous stage 14 to finish processing before starting operation on another sample. In this way the conversion rate of the ADC 10 is equal to the sampling rate of each stage 14.

Each stage 14 of the pipeline ADC 10 is described in more detail with reference to the circuit diagram of FIG. 2. An input sample and hold circuit 18 samples the input voltage $V_{in}$. A comparator 22 determines whether the sampled input voltage $V_{in}$ exceeds a middle value of the input voltage range. The value of the input voltage $V_{in}$ is multiplied by two and a value equal to one half of the input voltage range is added to or subtracted from the result. In this case the input voltage range $V_{in}$ is centered on zero and extends from $-V_{ref}$ to $+V_{ref}$. The result of this operation, called the residue $V_{res}$, is provided to the next stage 14. In this manner each pipeline stage 14 resolves a single bit. The resolution of the ADC 10 is defined by the number of stages 14. In some ADC implementations, multiple bits are resolved at each stage using a higher gain and one or more additional comparators and voltage references.

Figure 2:
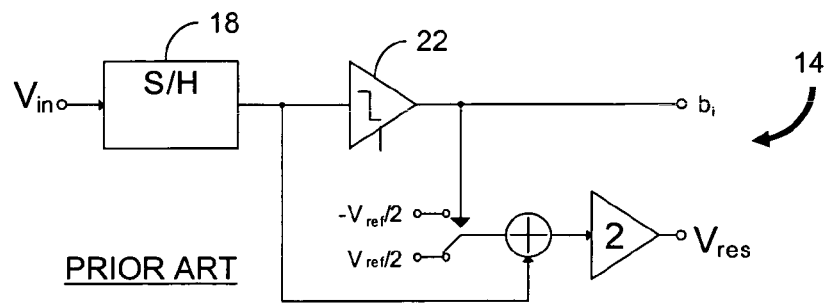
FIG. 2 is a circuit diagram of a stage of a conventional pipeline analog-to-digital converter.
Figure 3A:
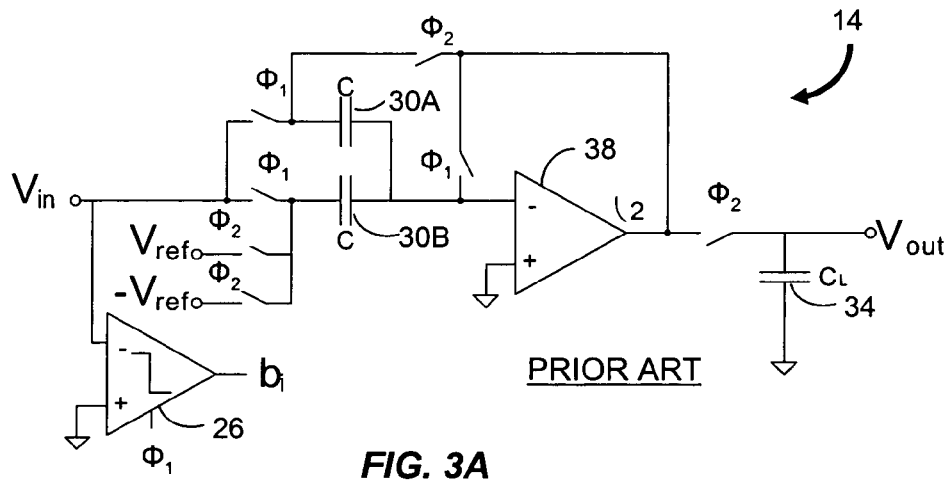
FIG. 3A is a detailed circuit diagram of the stage of FIG. 2.
Figure 3B:
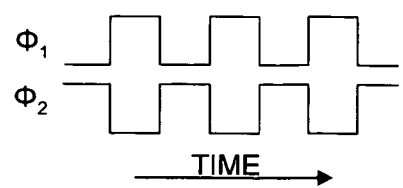
FIG. 3B is a timing diagram showing non-overlapping clock signals used to control the stage switches in the circuit of FIG. 3A.
Figure 4A:
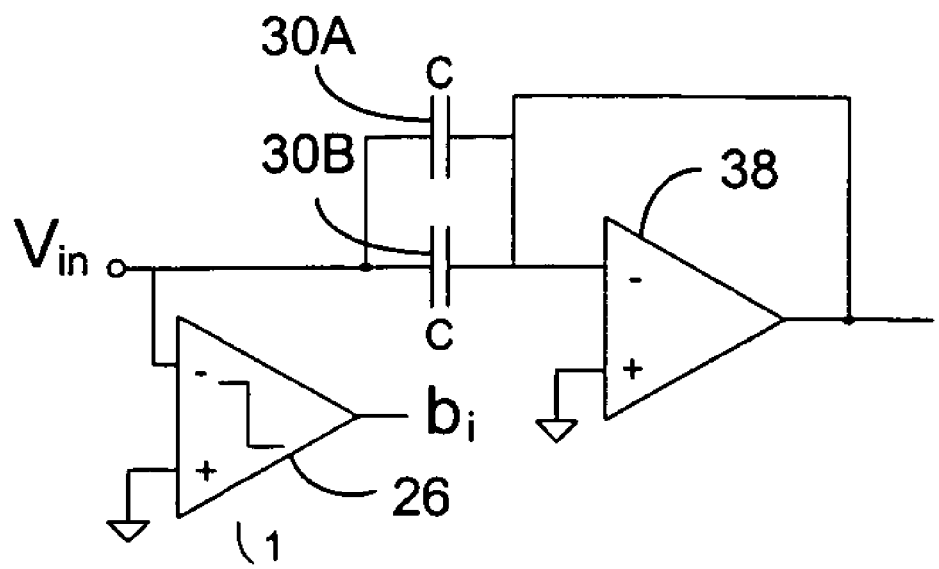
FIGS. 4A and 4B depict the effective circuit of FIG. 3A during a sampling phase and a multiply-by-two phase, respectively.
Figure 4B:
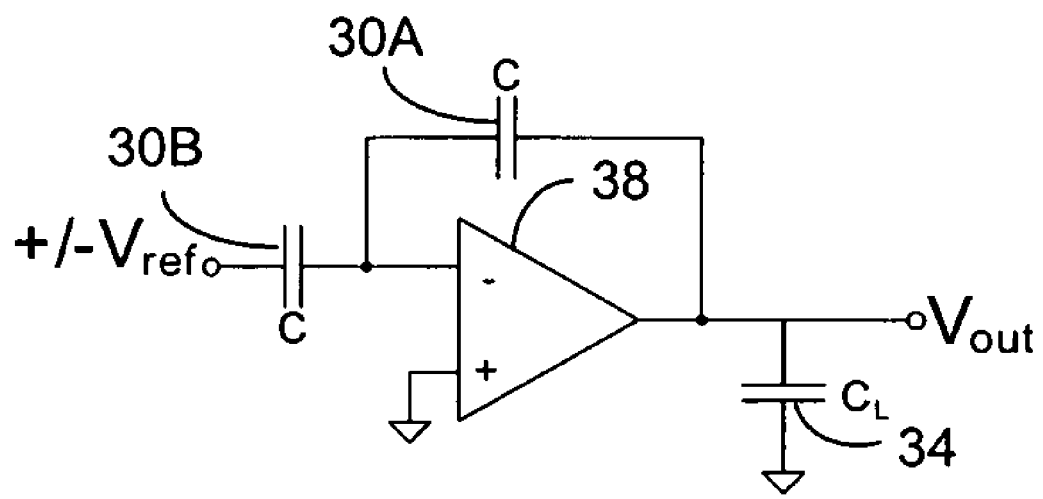

The stage 14 of FIG. 2 is shown in more detail in FIG. 3A. The non-overlapping clock signals $\phi_1$ and $\phi_2$ shown in FIG. 3B are used to control the stage switches in the circuit of FIG. 3A. The stage 14 is a switched capacitor circuit that includes a comparator 26, sampling capacitors C 30A and C 30B (generally C 30), a load capacitor $C_L$ 34 and a high gain op-amp 38. FIGS. 4A and 4B depict the effective circuit during a first (sampling) phase $\phi_1$ and a second (multiply-by-two) phase $\phi_2$, i.e., when clock signals $\phi_1$ and $\phi_2$, respectively, are at logical values sufficient to close (i.e., make conductive) the corresponding switches (also designated by $\phi_1$ or $\phi_2$). During the first phase $\phi_1$, the comparator 26 determines whether the input voltage $V_{in}$ is sufficiently high to assert a bit $b_i$ for the particular stage 14 and the input voltage $V_{in}$ is "sampled" onto the two capacitors C 30. During the second phase $\phi_2$, the sampled voltage is doubled and a reference voltage $V_{ref}$ is added or subtracted from the resulting voltage depending on the bit value $b_i$.

The performance of the pipeline ADC 10 depends on the performance of the high gain op-amp 38. The error value is inversely proportional to the gain and, therefore, the accuracy of the pipeline ADC 10 improves as the gain of the op-amp 38 increases. If the gain of the op-amp 38 is not sufficiently large, the stage 14 multiplies the input voltage $V_{in}$ by a value less than two and the voltage $V_{out}$ provided to the next stage 14 includes an error that limits the accuracy of the ADC 10. Consequently, it can be difficult to achieve a high accuracy pipeline ADC 10 based on inherent limitations in the op-amp 38 when using modern scaled CMOS processes.

Figure 5A:
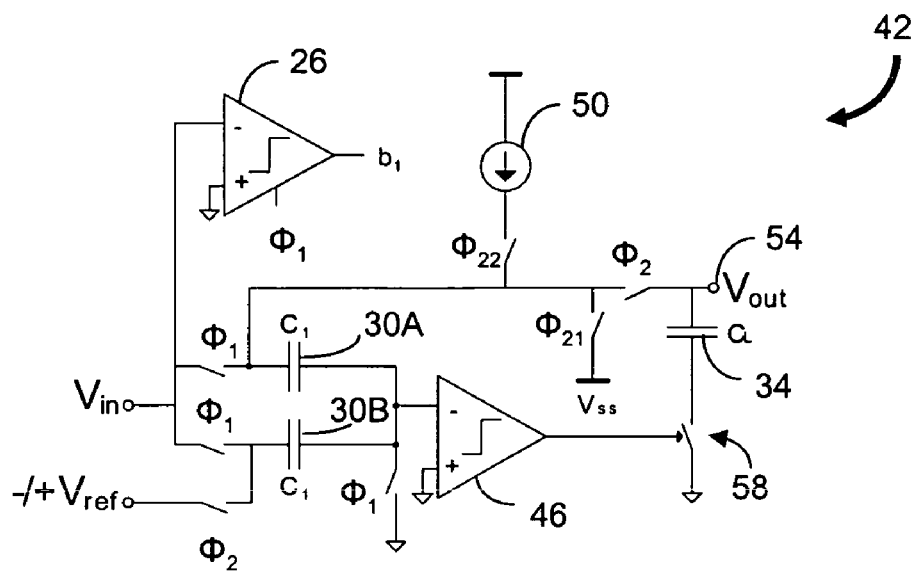
FIG. 5A is a circuit diagram of an embodiment of a stage of an analog-to-digital converter in accordance with the present invention.
Figure 5B:
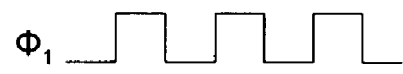
FIG. 5B is a timing diagram showing clock signals used to control the switches in the stage of FIG. 5A.

Referring to FIG. 5A, a stage 42 of an ADC constructed according to the present invention includes a clock controlled comparator 26, a non-clocked comparator 46, sampling capacitors C 30, a load capacitor $C_L$ 34 and a current source 50. Clock signals $\phi_1$, $\phi_2$, $\phi_{21}$ and $\phi_{22}$ used to control the switches in the stage 42 are shown in FIG. 5B. The design and fabrication of each stage 42 of the ADC is simplified due to the absence of the op-amp used in the stages of conventional pipeline ADCs described above.

Figure 5B:
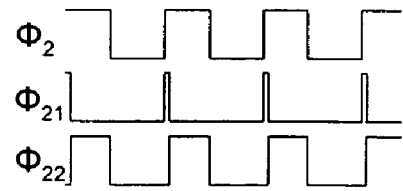
Figure 6A:
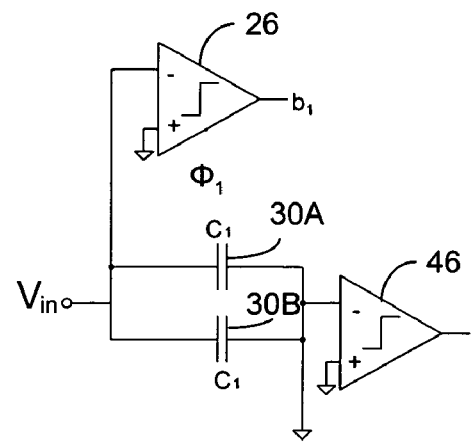
FIGS. 6A, 6B and 6C depict the effective circuit of FIG. 5A during a first, second and third clock phase, respectively.
Figure 6B:
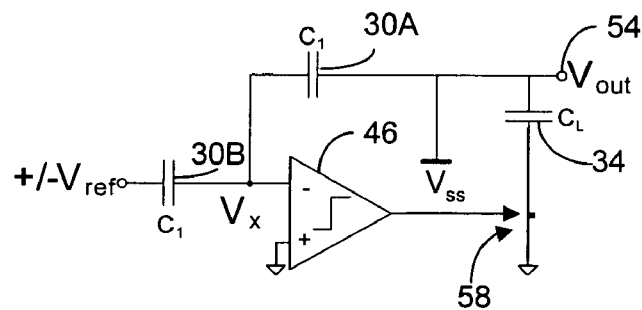
Figure 6C:
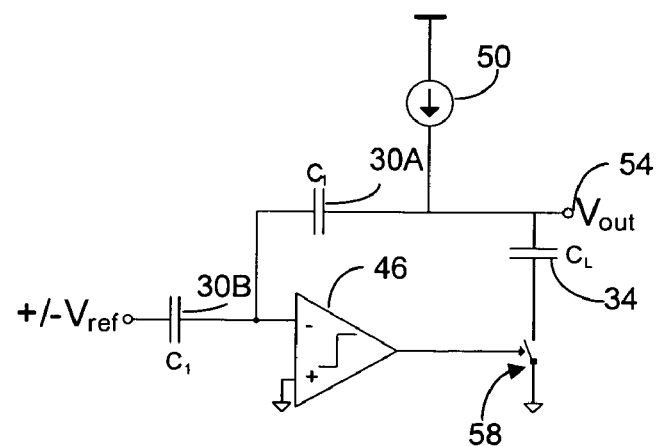

FIGS. 6A, 6B and 6C depict the operation of the ADC stage 42 of FIG. 5 during a first and second clock phase. During the first (sampling) phase $\phi_1$, the stage 42 operates in the same manner as a conventional ADC stage. In particular, the input voltage $V_{in}$ is sampled and the bit value $b_i$ corresponding to the stage 42 is determined. The second phase $\phi_2$ is divided into two parts $\phi_{21}$ and $\phi_{22}$. The first part $\phi_{21}$ has a short duration relative to the first phase $\phi_1$ and the second part of the second phase $\phi_{22}$. At the beginning of the second phase $\phi_{21}$, the output node $V_{out}$ is directly connected to the negative supply node $V_{SS}$ to ensure that the voltage $V_x$ at the inverting terminal of the comparator 46 is less than zero volts at the start of the second part of the second phase $\phi_{22}$. Thus the voltage $V_x$ at the non-inverting terminal is given by $$V_x = \frac{V_{SS}}{2} \pm \frac{V_{ref}}{2} - V_{in}.$$

During the second part of the second phase $\phi_{22}$, the current source 50 is connected to the output node 54. The voltages at the inverting terminal and the output terminal of the comparator 46 increase as the capacitors C 30 and $C_L$ 34 are charged by the current source 50. Throughout the second phase $\phi_{21}$, and $\phi_{22}$, the charge $Q_x$ at the inverting terminal of the comparator 46 is given by $$Q_x = -2V_{in}C$$

where C is the capacitance of the sampling capacitors C 30. When the voltage at the non-inverting terminal becomes zero, a switch 58 controlled by the output voltage of the comparator 46 opens (i.e., is made non-conducting) and the charging of the load capacitor $C_L$ 34 is terminated. At this time, the charge $Q_{Cl}$ on sampling capacitor C 30A is $$Q_{Cl} = 2V_{in}C \pm V_{ref}C.$$

Thus the output voltage $V_{out}$, which is the same as the voltage across sampling capacitor C 30A, is given by $$V_{out} = 2V_{in} \pm V_{ref}$$

which is the ideal (i.e., desired) output voltage $V_{outideal}$.

If the non-clocked comparator 46 is not bandwidth limited, the output voltage $V_{out}$ is produced without error; however, the finite delay of the comparator 46 results in an output voltage $V_{out}$ that "overshoots" the ideal voltage value $V_{outideal}$. The output voltage $V_{out}$ is therefore given by $$V_{out} = V_{outideal} + t_d \frac{I}{C_L}$$

where I is the charging current through the load capacitor $C_L$ 34 and $t_d$ is the finite delay time.

Although the illustrated embodiment is described with a current being supplied throughout the second part of the second phase $\phi_{22}$, the invention also contemplates that the various waveforms (i.e., time-dependent variations in current or voltage) can also be used.

Figure 7A:
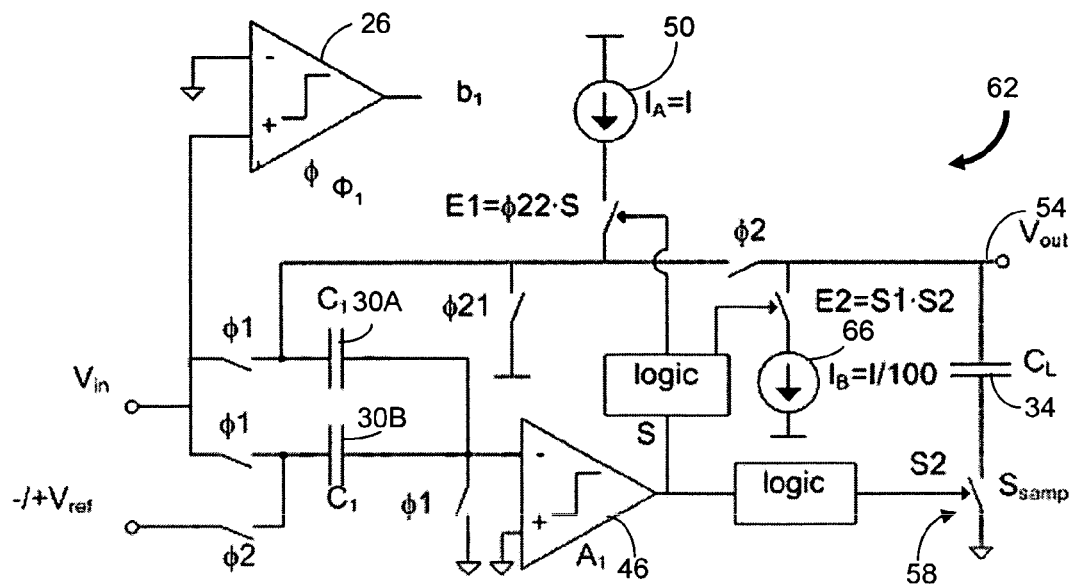
FIG. 7A is a circuit diagram of another embodiment of a stage of an analog-to-digital converter in accordance with the invention.
Figure 7B:
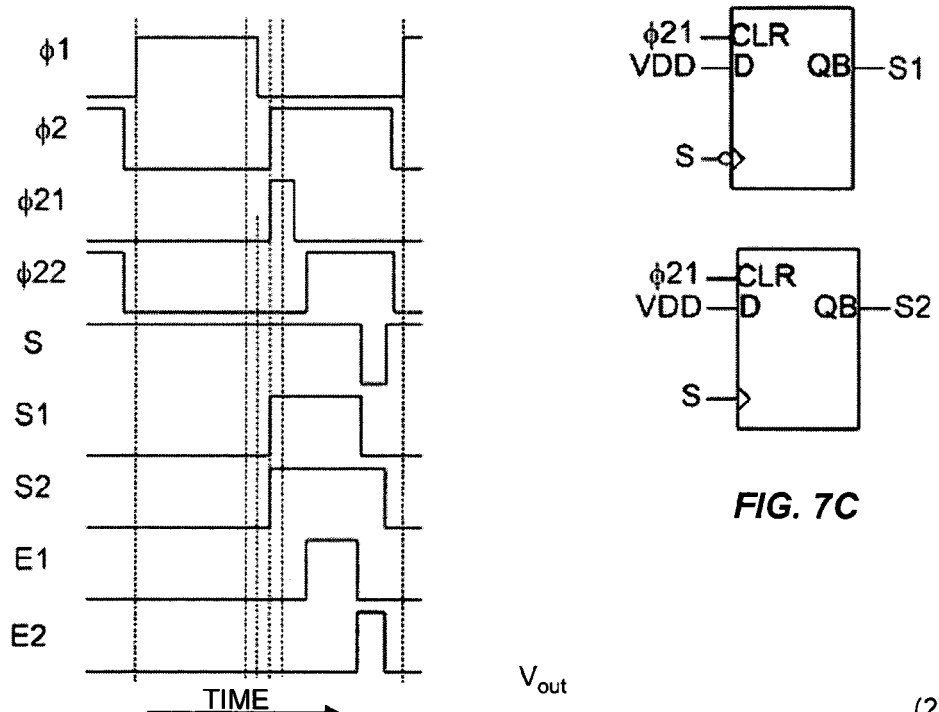
FIG. 7B is a timing diagram showing clock signals used to control the switches in the stage of FIG. 7A.
Figure 7C:
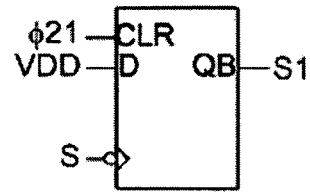
FIG. 7C depicts flip-flop configurations for generating a limited number of the switching signals shown in the timing diagram of FIG. 7B.
Figure 7C:
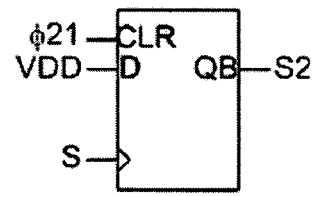
Figure 7D:
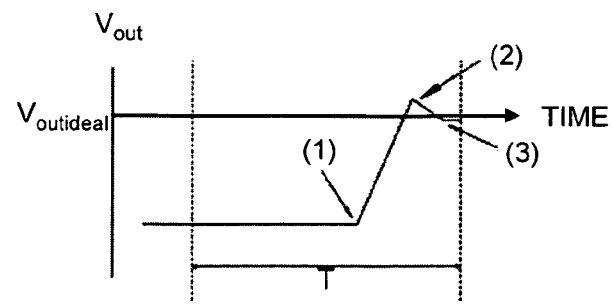
FIG. 7D is a graphical representation of the output voltage as a function of time for the stage of FIG. 7A.

FIG. 7A shows an embodiment of a stage 62 of an ADC according to the present invention. FIG. 7B shows the clock signals $\phi_1$, $\phi_2$, $\phi_{21}$ and $\phi_{22}$, and switching logic signals used to control the switches in the stage 62 of FIG. 7A. FIG. 7C depicts one means for generating the switching signals S1 and S2 from the switching signal S and clock signals $\phi_{21}$ and $\phi_{22}$ based on two D flip-flops. The stage 62 includes a secondary current source 66 to provide a current that is approximately 1% of the current provided by the main current source 50. The output voltage $V_{out}$, of the stage 62 is given by $$V_{out} = V_{outideal} - t_d \times \frac{I}{100 \times C_L}.$$

and is graphically depicted as a function of time in FIG. 7D. In particular, the output voltage $V_{out}$ starts to increase at the time (1) when the current source 50 is connected to the output node 54. At the time (2) when the output voltage of the comparator 46 changes state, the current source 50 is "switched off" and the secondary current source 66 is connected to the output node 54. Consequently, the output voltage $V_{out}$ decreases until a time (3) when the comparator switches back to its original state. At this time the sampling switch $S_{samp}$ 58 opens and sampling ends. Also at this time, the secondary current source 66 is "switched off."

Compared to a traditional pipeline ADC, an ADC constructed in accordance with the switched capacitor circuit of the present invention is more sensitive to switch resistance. The charging currents are conducted through switches having finite resistance, resulting in small voltage drops across the switches and, therefore, an error in the output voltage of the ADC. Low resistance switches can be used to ensure that the error does not limit the resolution of the ADC.

While the invention has been shown and described with reference to specific embodiments, it should be understood by those skilled in the art that various changes in form and detail may be made therein without departing from the spirit and scope of the invention. For example, the descriptions above are directed to an ADC; however, the switched capacitor circuit of the present invention can be utilized in other circuit embodiments such as sample-and-hold circuits, integrators and filters.

What is claimed is:

1. A switched capacitor circuit for performing an analog circuit function, comprising:
   a first switched capacitance network having an input terminal to receive a circuit input voltage during a first phase;

a comparator having an output terminal and an input terminal, the input terminal being in communication with the first switched capacitance network;

a second switched capacitance network having a first switched terminal in communication with the output terminal of the comparator; and a first current source in communication with the first and the second switched capacitance networks, the first current source supplying a current to charge the first and the second switched capacitance networks during a second phase.

2. The switched capacitor circuit of claim 1 further comprising a second current source in communication with the first and the second switched capacitance networks, the second current source supplying a current to compensate for a voltage error generated by a finite delay in a response of the comparator.

3. The switched capacitor circuit of claim 2 wherein the current supplied by the second current source has a magnitude that is substantially less than a magnitude of the current from the first current source.

4. The switched capacitor circuit of claim 1 wherein the comparator is a non-clocked comparator.

5. The switched capacitor circuit of claim 1 wherein the first switched capacitance network comprises a first capacitor and a second capacitor configured in one of a serial arrangement and a parallel arrangement in response to a plurality of clocking signals.

6. A method for performing an analog circuit function in a circuit comprising a comparator in communication with a switched capacitance network and a load capacitor, the method comprising:

sampling an input voltage using the switched capacitance network during a first phase;

applying a voltage present at a node in the switched capacitance network to an input terminal of the comparator during a first part of a second phase, the voltage at the node being responsive to the sampled circuit input voltage;

applying a reference voltage to the switched capacitance network during the first part of the second phase;

terminating the application of the reference voltage at the start of a second part of the second phase;

supplying a current to the switched capacitance network and the load capacitor during the second part of the second phase; and terminating the supplied current when an output state of the comparator changes during the second part of the second phase.

7. The method of claim 6 further comprising supplying a secondary current to the load capacitor subsequent to the termination of the supplied current.

8. The method of claim 7 further comprising terminating the secondary current to the load capacitor when the output state of the comparator changes subsequent to supplying the secondary current.

9. A method for performing an analog circuit function in a circuit comprising a comparator in communication with a switched capacitance network and a switched load capacitor, wherein the switched load capacitor has a switch to couple the switched load capacitor to a first reference voltage, the method comprising:

sampling an input voltage using the switched capacitance network during a first phase;

applying a voltage present at a node in the switched capacitance network to the input terminal of the comparator during a first part of a second phase, the voltage at the node being responsive to the sampled circuit input voltage;

applying a second reference voltage to the switched capacitance network during the first part of the second phase;

terminating the application of the second reference voltage at the start of a second part of the second phase; and supplying a first ramp waveform to the switched capacitance network and the load capacitor during the second part of the second phase.

10. The method of claim 9 further comprising turning off the switch to decouple the switched load capacitor from the first reference voltage when the output state of the comparator changes during the second part of the second phase.

11. The method of claim 9 further comprising supplying a second ramp waveform to the switched capacitance network and the switched load capacitor.

12. The method of claim 11 further comprising turning off the switch to decouple the switched load capacitor from the first reference voltage when the output state of the comparator changes subsequent to supplying the second ramp waveform.

13. The method of claim 9 wherein the first reference voltage equals the second reference voltage.

14. A stage for an analog to digital converter comprising:

a clocked comparator having an input terminal to receive an input voltage and provide a bit value in response thereto;

a comparator having an input terminal;

a first sampling capacitor and a second sampling capacitor each having a first terminal in communication with the input terminal of the comparator and each having a second terminal configured to receive the input voltage during the first phase, the second terminal of the first sampling capacitor being configured to receive a negative supply voltage during a first part of a second phase, the second terminal of the second sampling capacitor being configured to receive a second reference voltage during the second phase;

a first current source in communication with the second terminal of the first sampling capacitor during a second part of the second phase; and a load capacitor having a first terminal configured to receive the first reference voltage in response to an output voltage generated by the comparator and having a second terminal in communication with the second terminal of the first sampling capacitor during the second phase.

15. The stage of claim 14 further comprising a second current source in communication with the second terminal of the load capacitor during a portion of the second phase to supply a current to compensate for a voltage error generated by a finite delay in a response of the output voltage generated by the comparator.

16. The stage of claim 15 wherein the current supplied by the second current source has a magnitude that is substantially less than a magnitude of a current from the first current source.

* * * * *